US006642706B2

(12) United States Patent
Shen

(10) Patent No.: US 6,642,706 B2
(45) Date of Patent: Nov. 4, 2003

(54) DETECTION OF ASYMMETRICAL LOAD IN AN AC CIRCUIT

(75) Inventor: Eric Bertrand Shen, Scarborough, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 138 days.

(21) Appl. No.: 09/880,184

(22) Filed: Jun. 13, 2001

(65) Prior Publication Data

US 2002/0190704 A1 Dec. 19, 2002

(51) Int. Cl.[7] ............................................ G01R 19/22

(52) U.S. Cl. .................................... 324/120; 324/158.1

(58) Field of Search ............................ 324/117 R, 120, 324/771, 158.1; 323/222, 280, 282, 289, 356; 361/18, 33, 90, 187; 363/15, 19, 56.05, 73, 132

(56) References Cited

U.S. PATENT DOCUMENTS 5,331,534 A 7/1994 Suzuki et al. ................. 363/20
5,422,562 A * 6/1995 Mammano et al. .......... 323/282
6,118,295 A * 9/2000 Murayama et al. .......... 324/771

OTHER PUBLICATIONS

"Ballast Electronique Compact" Electronique, CEP Communication, Paris, FR, No. 37, Apr. 1, 1994, pp. 76/77.

* cited by examiner

*Primary Examiner*—Ernest Karlsen
*Assistant Examiner*—Minh N. Tang

(57) ABSTRACT

A circuit for detecting if a load supplied with a high frequency AC power source is asymmetrical. The input voltage and a DC blocking voltage are connected to a differential amplifier circuit, and any difference in voltage is signaled. The load voltage and the DC blocking voltage are each reduced, for example, to 10% and 20%, respectively, while keeping them proportional to their respective full values.

24 Claims, 2 Drawing Sheets

DETECTION OF ASYMMETRICAL LOAD IN AN AC CIRCUIT

FIELD OF THE INVENTION

The present invention relates to the field of AC electrical power supply circuits, and more particularly to AC electrical power supply circuits in which the load characteristics may be non-symmetrical.

BACKGROUND OF THE INVENTION

Electrical load symmetry is defined as the impedance of the load being substantially equal whether the supplied electrical drive power is positive or negative. Symmetry is typically desired as it maintains optimum system performance.

In certain cases, for example a discharge lamp, although the basic configuration is designed in a symmetrical fashion, it may perform asymmetrically. For example, a lamp that operates with symmetric impedance when oriented horizontally may not operate symmetrically when in a vertical orientation. The voltage drop across the lamp will be different on the positive part of the cycle than on the negative part. Evaluation and possible correction of this condition can be achieved if a means is available to first detect the lack of symmetry.

Therefore, it is an object of the present invention to provide a modified AC electrical power supply drive circuit that includes means to determine the symmetry or lack thereof in a load.

This and other objects will become more apparent from the description of the invention to follow.

SUMMARY OF THE INVENTION

A circuit and method are provided for detecting an asymmetrical load characteristic when being supplied with a high frequency AC power source. The voltage across a DC blocking capacitor is compared through an operative amplifier with a scaled version of the input voltage, and any difference is signaled. The DC blocking voltage and the scaled input voltage are each further scaled down, for example to 10 percent, in order to reduce the voltages being compared, while keeping them proportional to their respective full values. Preferably, first and second connective means comprising first and second resistive dividing networks provide the scaled input voltage and the scaled DC blocking voltage, respectively.

BRIEF DESCRIPTION OF THE DRAWINGS

The present invention is described below in conjunction with the enclosed drawings in which similar components are identified with similar numbers.

DETAILED DESCRIPTION OF THE INVENTION

Figure 1:
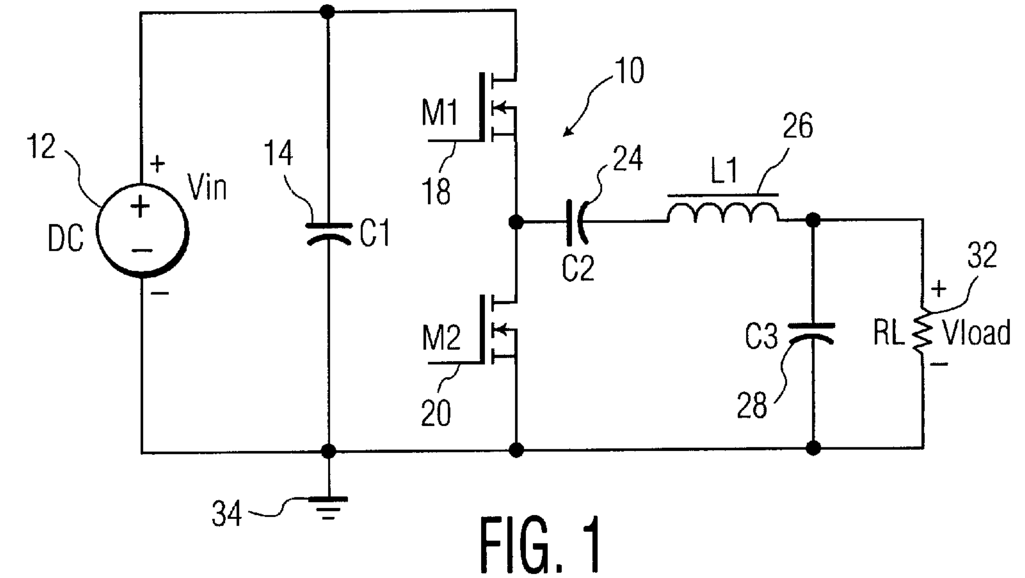
FIG. 1 PRIOR ART
FIG. 1 is a diagrammatic circuit of a high frequency driven AC power supply to a load according to the prior art.

FIG. 1 portrays a typical circuit 10 according to the known art for high frequency AC supply to a load. Circuit

10 includes DC power supply 12 which is connected in parallel to first capacitor 14 and a pair of series connected MOSFET switches 18 and 20. Switches 18 and 20 are caused to be alternately actuated at high frequencies, for example 50 KHz. A line is tapped off the junction of switch 18 to switch 20 and connects to second capacitor 24, which feeds inductor 26. The output of inductor 26 connects to third capacitor 28 and load 32 in parallel. The output from first capacitor 14, switch 20, third capacitor 28, and load 32 each connect to a ground 34.

Switches 18 and 20 are alternately driven at a 50% duty cycle to convert the DC voltage from DC supply 12 to a square wave AC voltage which feeds the filter formed by capacitors 24, 28, inductor 26 and load 32. Second capacitor 24 is a DC blocking capacitor which removes the DC component fed to the filter, leaving only AC components present in the load. DC blocking capacitor 24 also corrects for possible imbalances in the duty cycle. The combination of inductor 26 and third capacitor 28 eliminates higher frequency components and effectively converts the square wave AC to a sinusoidal form as is preferred.

The circuit described above in relation to FIG. 1 operates satisfactorily where the load is electrically symmetrical. However, as noted above, if load 32 is asymmetrical, the performance of the system may be degraded.

Figure 2:
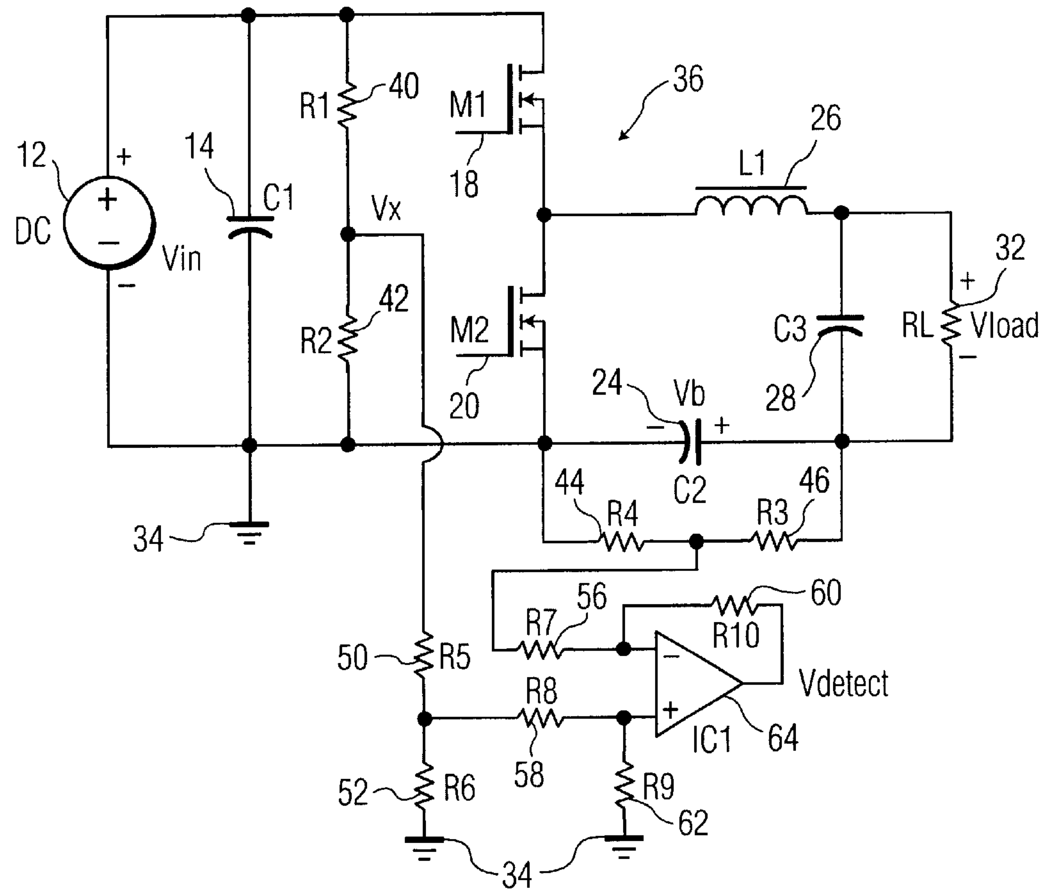
FIG. 2 is a diagrammatic circuit of a high frequency AC power supply to a load according to the preferred embodiment of the present invention.

Referring now to FIG. 2, a modified circuit 36 is provided with the added capacity to determine whether an asymmetrical load condition exists. In effect, circuit 36 provides means for sampling a scaled version of the input voltage and the DC blocking capacitor voltage and means for determining of they are equal. Circuit 36 utilizes the basic circuit 10 of FIG. 1 and adds components in a manner to enable an unbalanced load to be determined. Blocking capacitor 24 is moved to a ground referenced position to facilitate the sensing of its voltage. A dividing pair of series-connected resistors 40 and 42 are connected in parallel with switches 18 and 20 with a central tap between resistors 40 and 42 feeding to a second pair of series-connected dividing resistors 50 and 52, also connected to ground 34. Resistors 40 and 42 are, according to the preferred embodiment, substantially equal in resistance, although it is recognized that unequal resistors may be used in certain situations, providing their relationships are known. Resistors 50 and 52 are used to reduce the sensed voltage to a level appropriate for amplifier 64. The divided voltage from resistors 50 and 52 connects to a first feeding resistor 58, the output of which connects as a sample of input voltage to ground through output resistor 62 and to the positive terminal of operative amplifier 64. The resultant voltage applied to feeding resistor 58 preferably will be on the order of 10% of the input voltage. A third pair of dividing resistors 44 and 46 are connected in parallel across second capacitor 24 with a central tap connected therebetween. The divided voltage from resistors 44 and 46 connects to a second feeding resistor 56, the output of which connects as a sample of load voltage to the negative terminal of operative amplifier 64. The output signal from operative amplifier 64 is connected through feedback resistor 60 back to the negative terminal of operative amplifier 64. The resultant voltage applied to feeding resistor 56 preferably will be on the order of 20% of the blocking capacitor voltage. When switches 18 and 20 are driven at 50% duty cycle and the load is symmetric, the voltage across the DC blocking capacitor 24 will be exactly one half of the input voltage. If the load is asymmetric, the DC blocking capacitor voltage will deviate from one half of the input voltage. This difference can therefore be sensed in order to determine the symmetry or asymmetry of the load.

As illustrated and described, circuit 36 delivers a pair of parallel signals at a scaled down voltage derived from the input voltage and the voltage across DC blocking capacitor 24 to the inputs of operative amplifier 64 so that a difference in voltage will be detected. The output voltage from operative amplifier 64 will be applied to a detection device, for example a meter or a signal generator (not shown).

Figure 3:
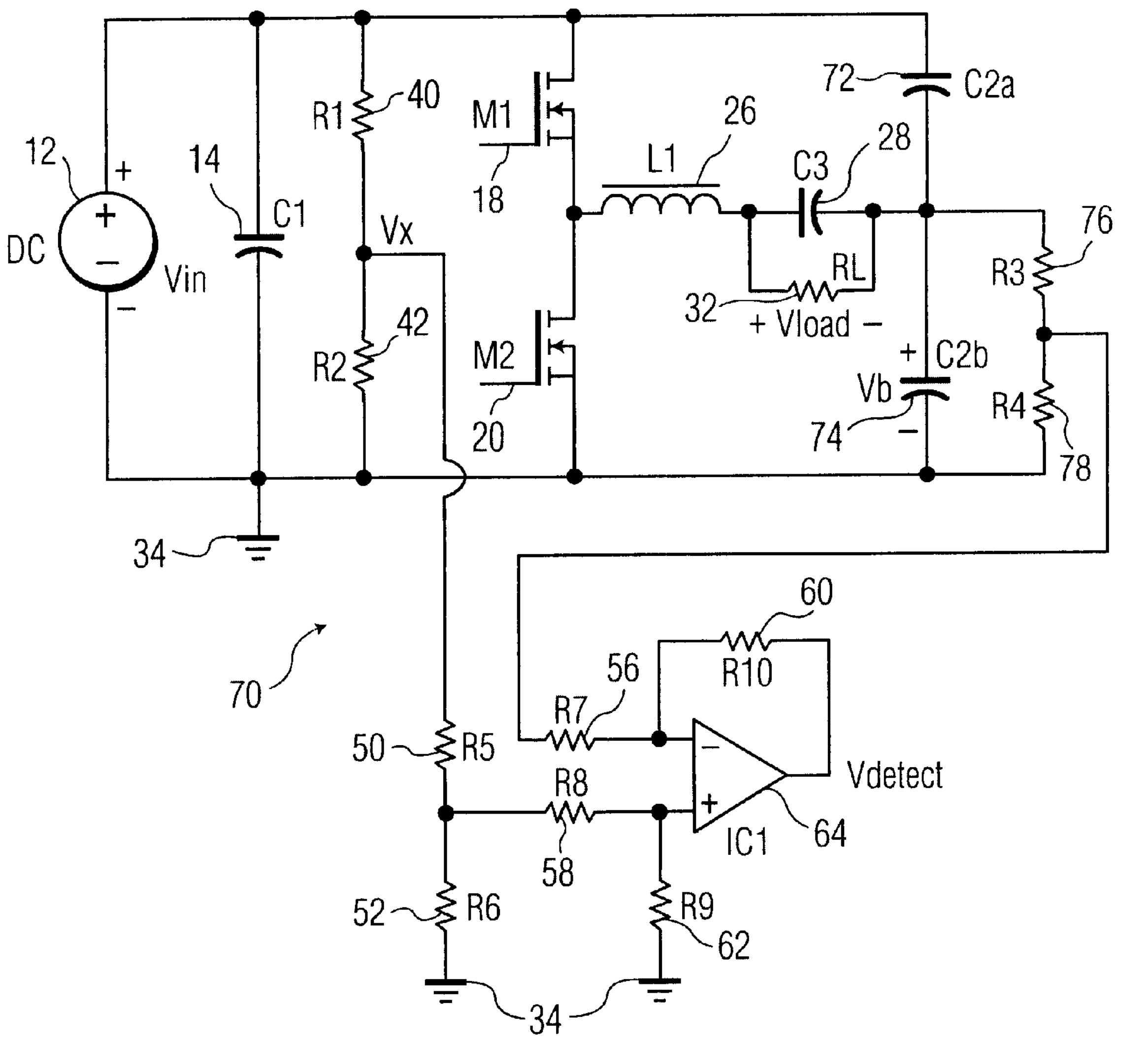
FIG. 3 is a diagrammatic circuit of a high frequency AC power supply to a load according to a second embodiment of the present invention.

Referring now to FIG. 3, a second preferred embodiment of the invention is shown. The preliminary portions of the circuit illustrated in FIG. 3 are similar to comparable portions of the circuit shown in FIG. 2. Thus, those skilled in the art will note that the DC voltage source 12, first capacitor 14, alternating switches 18 and 20, dividing resistors 40, 42, dividing resistors 50, 62 and first feeding resistor 58, and ground resistor 62 are similarly situated to that described above. In the arrangement of FIG. 3, inductor 26 is connected in series to the parallel pair of capacitor 28 and load 32. A first dividing capacitor 72 is connected from the drain of switch 18 to a first side of a pair of series connected dividing resistors 76 and 78. A second dividing capacitor 74 is connected in parallel with series-connected dividing resistors 76 and 78. A tap between dividing resistors 76 and 78 connects to second feeding resistor 56, which feeds to the negative terminal of operative amplifier 64. The output of first feeding resistor 58 is connected to the positive terminal of operative amplifier 64 and also to ground resistor 62 which is also connected to ground. The output signal from amplifier 64 feeds back through resistor 60 to connect to the negative terminal of operative amplifier 64 and the output terminal of second feed resistor 56.

Thus, the circuit presented in FIG. 3 and described above implements the DC blocking voltage function by a pair of matched capacitors 72, 74. An analog comparison of the scaled input and DC blocking voltage through operative amplifier 64 will give an indication of load symmetry by determining if the sampled input voltage and the sampled DC blocking voltage are equal or unequal. A meter or other detection device (not shown) is connected to the output of operative amplifier 64. In either the circuit of FIG. 2 or the circuit of FIG. 3, a similar comparison results in the detection of asymmetry of load.

While the present invention is described with respect to specific embodiments thereof, it is recognized that various modifications and variations thereof may be made without departing from the scope and spirit of the invention, which is more clearly understood by reference to the claims appended hereto.

What is claimed is:

1. A circuit for the detection of an asymmetrical electrical load, comprising:

(a) means for sampling an input voltage;

(b) means for sampling a DC blocking voltage related to said input voltage; and (c) means for determining if the sampled input voltage and the sampled DC blocking voltage are equal.

2. The circuit for the detection of an asymmetrical electrical load as claimed in claim 1, wherein the means for determining if the sampled input voltage and the sampled DC blocking voltage are equal comprises an operative amplifier to which the input voltage and the DC blocking voltage are connected.

3. The circuit for the detection of an asymmetrical electrical load as claimed in claim 1, wherein the sampled input voltage is a scaled down voltage and the sampled DC blocking voltage is a scaled down voltage.

4. The circuit for the detection of an asymmetrical electrical load as claimed in claim 3, wherein the scaled down input voltage and the scaled down DC blocking voltage are respectively substantially 10% of the full input and 20% of the DC blocking voltages.

5. The detection circuit as claimed in claim 1 further comprising a DC blocking capacitor coupled between an input terminal of the circuit and the electrical load and across which a DC blocking voltage is developed which is approximately equal to said input voltage in the presence of a symmetrical electric load.

6. The detection circuit as claimed in claim 1 further comprising:

an input terminal adapted for connection to a DC supply voltage for the circuit, and wherein the sampled DC blocking voltage includes a further DC component of voltage attributable to asymmetric operation of the electrical load.

7. The detection circuit as claimed in claim 1 further comprising:

an input terminal for supplying a DC input voltage to the detection circuit, an output terminal for connection to the electrical load, a DC blocking capacitor coupled in series with the electrical load, and a DC/AC converter circuit coupled to the input terminal and to the output terminal so as to supply an AC voltage to the output terminal from the DC input voltage.

8. The detection circuit as claimed in claim 1 wherein the input voltage is a DC voltage, the circuit further comprising:

a DC/AC converter for converting the DC input voltage to an AC supply voltage for operation of the electrical load, and a DC blocking capacitor for deriving the DC blocking voltage and connected in the circuit in a manner such that only an AC voltage appears in the electrical load during symmetrical operation thereof.

9. The detection circuit as claimed in claim 8 wherein the DC blocking capacitor is connected to a ground referenced position in the detection circuit.

10. A circuit for the detection of an asymmetrical electrical load, comprising;

(a) apparatus for comparing two voltages, the apparatus having a positive input terminal, a negative input terminal, and an output terminal;

(b) first connective means connected from a circuit node in electrical contact with an input voltage of the circuit to the positive input terminal;

(c) second connective means connected from a circuit node in electrical contact with a DC blocking voltage of the circuit to the negative input terminal; and (d) a detection device connected to the output terminal to signal detection of an asymmetrical electrical load when the two compared voltages are unequal.

11. The circuit for the detection of an asymmetrical electrical load as described in claim 10, further comprising dividing resistors connected in the first connective means in a manner to scale down the input voltage.

12. The circuit for the detection of an asymmetrical electrical load as described in claim 10, further comprising dividing resistors connected in the second connective means in a manner to scale down the DC blocking voltage.

13. The circuit for the detection of an asymmetrical electrical load as described in claim 10, wherein the apparatus for comparing two voltages comprises an operative amplifier connected in the circuit so that the DC blocking voltage is independent of an output signal of the operative amplifier.

14. The circuit for the detection of an asymmetrical electrical load as described in claim 10, wherein the detection device comprises a meter.

15. A method for the detection of an asymmetrical electrical load, comprising the steps of:

(a) sampling an input voltage;

(b) sampling a DC blocking voltage that is determined by the input voltage; and (c) determining if the sampled input voltage and the sampled DC blocking voltage are equal.

16. The method for the detection of an asymmetrical electrical load as claimed in claim 15, wherein the step of determining if the sampled input voltage and the sampled DC blocking voltage are equal comprises supplying the sampled input voltage and the sampled DC blocking voltage to opposite terminals of an operational amplifier and evaluating the output therefrom.

17. The method of the detection of an asymmetrical electrical load as claimed in claim 15, wherein the step of sampling an input voltage comprises extracting a scaled down voltage thereof and the step of sampling a DC blocking voltage comprises extracting a scaled down voltage thereof.

18. A The method for the detection of an asymmetrical electrical load as claimed in claim 17, wherein the sampled input voltage and the sampled DC blocking voltage are respectively substantially 10% of the full input voltage and 20% of the DC blocking voltage.

19. A circuit for operating an electric load, comprising:

an input terminal for connection to a source of input voltage for the circuit, an output terminal for connection to the electric load, means coupled to the input terminal for deriving an AC supply voltage for the output terminal, means coupled to the output terminal for deriving a DC blocking voltage related to the input voltage at the input terminal, first and second means for deriving a sample of the input voltage and a sample of the DC blocking voltage, respectively, and means for comparing the sample of the input voltage and the sample of the DC blocking voltage so as to derive a signal indicative of a symmetrical operation of an electric load when the compared sampled voltages are unequal.

20. The operating circuit as claimed in claim 19 wherein, the DC blocking voltage deriving means comprises a DC blocking capacitor, and the input voltage at the input terminal is DC voltage.

21. The operating circuit as claimed in claim 20 wherein, for a symmetrical electric load, the DC blocking voltage is approximately equal to the DC input voltage.

22. The operating circuit as claimed in claim 20 wherein the DC blocking capacitor is connected in series with an electric load when the electric load is connected to the output terminal, and for a symmetrical electric load, the DC blocking voltage is approximately equal to the DC input voltage.

23. The operating circuit as claimed in claim 19 wherein, the input voltage at the input terminal is a DC voltage, and the means for deriving an AC supply voltage includes a bridge circuit comprising first and second switching transistors serially coupled to the input terminal, first and second capacitors serially coupled to the input terminal, wherein the output terminal is coupled to at least one of a circuit point between the first and second switching transistors and a circuit point between the first and second capacitors, and one of said first and second capacitors is also operative as said means for deriving the DC blocking voltage.

24. The operating circuit as claimed in claim 19 wherein the DC blocking voltage deriving means comprises a DC blocking capacitor coupled in series with an electric load.

* * * * *